US008166426B2

(12) United States Patent
Arbel et al.

(10) Patent No.: US 8,166,426 B2
(45) Date of Patent: Apr. 24, 2012

(54) APPROXIMATION OF A CLOCK GATING FUNCTION VIA BDD PATH ELIMINATION

(75) Inventors: Eli Arbel, Nesher (IL); Oleg Rokhlenko, Haifa (IL)

(73) Assignee: International Business Machines Corporation, Armonk, NY (US)

(*) Notice: Subject to any disclaimer, the term of this patent is extended or adjusted under 35 U.S.C. 154(b) by 914 days.

(21) Appl. No.: 12/191,732

(22) Filed: Aug. 14, 2008

(65) Prior Publication Data

US 2010/0042569 A1 Feb. 18, 2010

(51) Int. Cl.
*G06F 17/50* (2006.01)
(52) U.S. Cl. ........................................................ 716/103
(58) Field of Classification Search .................... 706/45; 716/103, 97
See application file for complete search history.

(56) References Cited

OTHER PUBLICATIONS

Yi-Yu Liu; Kuo-Hua Wang; TingTing Hwang; Liu, C.L.;, "Binary decision diagram with minimum expected path length," Design, Automation and Test in Europe, 2001. Conference and Exhibition 2001. Proceedings, vol., No., pp. 708-712, 2001 doi: 10.1109/DATE. 2001.915105 URL: http://ieeexplore.ieee.org/stamp/stamp.jsp?tp=&arnumber=915105&isnumber=19761.*
R.E. Bryant, C.Meinel, "Ordered Binary Decision Diagrams in Electronic Design Automation: Foundations, Applications and Innovations", Ed. S. Hassoun and T. Sasao, Kluwer Academic Publishers, Dordrecht/Netherlands p. 285-307, 2001.*
Mazhar Alidina, et al., Precomputation-Based Sequential Logic Optimization for Low Power, IEEE Transactions on Very Large Scale Integration (VLSI) Systems, vol. 2, No. 4., Dec. 1994.
Uwe Hinsberger, et al., Approimative Representation of boolean Functions by size controllable ROBDD's, Lehrstuhl fur Informatik V, Bayerische Julius-Maximilians-Universitat Wurzburg, Zwinger 34, 97070 Wurzburg, Germany, Sep. 1997.
L. Benini, et al., Symbolic Synthesis of Clock-Gating Logic for Power Optimization of Synchronous Controllers, ACM Transactions on Design Automation of Electronic Systems, vol. 4, No. 4., Oct. 1999, pp. 351-375.
P.W.C. Prasad, et al., BDD Path Length Minimization Based on Initial Variable Ordering, Journal of Computer Sciences 1 (4): 521-529, 2005.
P.W.C. Prasad, et al., Minimum Average Path Length in BDDs based on Static Variable Ordering, IEEE, 2005, pp. 716-719.

(Continued)

*Primary Examiner* — Jeffrey A Gaffin
*Assistant Examiner* — Ola Olude-Afolabi
(74) *Attorney, Agent, or Firm* — Cantor Colburn LLP; Yoav Alkalay

(57) ABSTRACT

A method for reducing a depth of binary decision diagram includes identifying, with a processing device, one or more less probable positive paths within the binary decision diagram, the less probable positive paths within the binary decision diagram include a number of decision nodes from a starting variable to a positive, binary logic "1" terminal node within the binary decision diagram, and the identified less probable positive paths are eliminated. Identifying the less probable positive paths within the binary decision diagram includes: assigning $f$ to the binary decision diagram, assigning K to a depth threshold of the binary decision diagram, and constructing a second binary decision diagram g by logically ORing together positive paths in $f$ that have a length above K. Eliminating the identified less probable positive paths in $f$ comprises obtaining an approximated function $f'$, by conjuncting $f$ and the negation of g, such that $f'=f\widehat{g}$.

22 Claims, 3 Drawing Sheets

After approximation

OTHER PUBLICATIONS

Gorschwin Fey, et al., Minimizing the Number of Paths of BDDs, Institute of Computer Science, University of Bremen, 28359 Bremen Germany.

Mario Hilgemeier, et al., Minimizing the Number of One-Paths in BDDs by an Evolutionary Algorithm, Institute of Computer Science, University of Bremen, 28359 Bremen Germany.

Maciej Ciesielski, Logic Synthesis Part III, University of Massachusetts, Amherst, MA.

Congguang Yang, et al., Synthesis for CMOS/PTL Circuits, Department of Electrical & Computer Engineering, University of Massachusetts, Amherst, MA.

* cited by examiner

Before approximation

After approximation

| a b c d | f |
|---------|---|
| 0 0 0 0 | 0 |
| 0 0 0 1 | 0 |
| 0 0 1 0 | 0 |
| 0 0 1 1 | 0 |
| 0 1 0 0 | 0 |
| 0 1 0 1 | 0 |
| 0 1 1 0 | 1 |
| 0 1 1 1 | 1 |
| 1 0 0 0 | 1 |
| 1 0 0 1 | 0 |
| 1 0 1 0 | 1 |
| 1 0 1 1 | 0 |
| 1 1 0 0 | 1 |
| 1 1 0 1 | 1 |
| 1 1 1 0 | 1 |
| 1 1 1 1 | 1 |

APPROXIMATION OF A CLOCK GATING FUNCTION VIA BDD PATH ELIMINATION

BACKGROUND

The present invention relates to digital logic design, and, more specifically, to achieving an approximation of a clock gating function in digital logic by reducing the depth or number of paths of the function's corresponding binary decision diagram ("BDD"), thus yielding an approximated clock gating function with a smaller delay time.

Reducing power consumption in digital electronic logic circuits is currently one of the primary goals in digital logic design. Among the many techniques for power reduction, clock gating is well known, particularly for sequential or synchronous (i.e., "clocked") circuits comprising combinational gates and storage components (e.g., edge-triggered flip-flops). Clock gating comprises the method of simply stopping the clock during certain periods of time; for example, when the flip-flops and/or its inputs are not changing state (i.e., the flip-flops are "idle"). Stopping the clock saves power because the energy dissipation of, e.g., a CMOS circuit, is directly related to the amount of switching activity occurring within the circuit.

The growing popularity of clock gating has given rise to the development of several tools for automatic clock gating in recent years. While many clock gating functions can be derived by a clock gating tool in a given design, some of the gating functions are not practical, for example, from a timing perspective. In such cases, these clock gating functions are most likely to be rejected by synthesis tools. In fact, timing constraints is one of the relatively more limiting factors for clock gating in high-performance electronic designs.

In an attempt to exploit the full potential of clock gating in a given design, methods for reducing the size of clock gating functions, commonly referred to as function approximation methods, have been suggested. An iterative method is known for approximating a function by reducing the number of function variables presented. At each iteration, the variable whose removal from the function results in the smallest error is eliminated by universal quantification. This method suffers from two primary disadvantages: first, it is relatively computationally demanding, as finding the best variable for elimination is performed by applying n universal quantifications, where n is the number of function variables. Secondly, it may result in too coarse of an approximation, thereby reducing the probability of the on-set too much, whereas a better clock gating condition, i.e., one with higher probability and thus one that saves more power that still satisfies timing constraints, can be derived. Another approach suggests an approximation heuristic that prunes minterms having probabilities below a given threshold, using a pseudo-Boolean function for representing minterm probabilities. A problem with this approach is that while it performs relatively finer approximation steps than in known methods, the minterm probabilities function can be exponentially large in the number of signals it depends on.

Besides the aforementioned analytical methods, a common practical approach represents the Boolean function of the clock gating function using a binary decision diagram ("BDD") and approximates this function using the unique properties of such a representation. In general, a BDD is a directed acrylic graph ("DAG") that is rooted and comprises a number of decision nodes and two terminal nodes referred to as the "0-terminal" and the "1-terminal", with several paths passing through the decision nodes and ending at either one of the terminal nodes. The depth of a BDD is bounded from above by the number of variables of the BDD. Being a Boolean function in their nature, clock gating functions can be represented using BDDs. This type of representation allows the information relating to the clock gating function to be stored in a relatively compact manner, sometimes allowing the BDD representation to have a number of paths that is a polynomial in terms of the number of variables in the function. In general, the amount of time for evaluating the function represented by the BDD given a valuation of its variables is directly related to the depth or path length. Thus, a goal is to minimize the maximal path length of a BDD to reduce the corresponding amount of worst-time for evaluating the function.

Logic synthesis of BDDs (i.e., constructing a circuit which represents the Boolean function encoded by the BDD) may be carried out using known BDD decomposition techniques. As such, the logic depth and, thus, the logic delay of a digital logic electronic circuit obtained by BDD decomposition synthesis is correlated to the depth of the synthesized BDD. Therefore, from a timing perspective, it is desirable to represent Boolean functions with BDDs of relatively small depths or number of nodes. Although several methods exist for reducing the depth of a BDD by using a dynamic or static variable ordering algorithm, there are still cases where the BDD depth cannot be reduced below a desired threshold due, for example, to the complexity of the function logic.

Nevertheless, the usage of BDDs allows the use of alternative methods for function approximation. For example, an approximated function may be obtained by iteratively eliminating nodes in the BDD. BDD nodes that incur small approximation errors are eliminated by directing all incoming edges of these nodes to the zero-terminal node. However, since this method is applied independently on each level of the BDD, it reduces the BDD node count by decreasing the BDD width instead of its depth.

Unfortunately, none of the above known methods utilizes or considers timing constraints as approximation criteria during BDD reduction, but are directed instead at approximating functions while trading-off approximation error for BDD implementation size. No known method exists for approximating clock gating functions while considering timing constraints.

BRIEF SUMMARY

In one embodiment, a method for reducing a depth of binary decision diagram includes identifying, with a processing device, one or more less probable positive paths within the binary decision diagram, wherein the one or more less probable positive paths within the binary decision diagram include a number of decision nodes from a starting variable to a positive, binary logic "1" terminal node within the binary decision diagram; and eliminating, using the processing device, the identified one or more less probable positive paths within the binary decision diagram; wherein identifying the one or more less probable positive paths within the binary decision diagram further includes: assigning $f$ to the binary decision diagram; assigning K to a depth threshold of the binary decision diagram; constructing a second binary decision diagram g by logically ORing together positive paths in $f$ that have a length above K; and wherein eliminating the identified one or more less probable positive paths in $f$ comprises obtaining an approximated function $f'$, by conjuncting $f$ and the negation of g, such that $f'=f \cdot \bar{g}$.

In another embodiment, a computer program product includes a storage medium having computer-readable instructions stored thereon that, when executed by a computer, implement a method for reducing a depth of a binary decision diagram. The method includes identifying one or more less probable positive paths within the binary decision diagram, wherein the one or more less probable paths within the binary decision diagram include a number of decision nodes from a starting variable to a positive, binary logic "1" terminal node within the binary decision diagram; and eliminating the identified one or more less probable positive paths within the binary decision diagram; wherein identifying the one or more less probable positive paths within the binary decision diagram further includes: assigning $f$ to the binary decision diagram; assigning K to a depth threshold of the binary decision diagram; constructing a second binary decision diagram g by logically ORing together positive paths in $f$ that have a length above K; and wherein eliminating the identified one or more less probable paths in f comprises obtaining an approximated function f', by conjuncting $f$ and the negation of g, such that $f'=f\bar{g}$.

In another embodiment, a system for performing a reduction in a depth of a binary decision diagram includes a computing network including a processing device in communication with one or more computer memory storage devices; and the computing network further configured to implement a method for reducing a depth of a binary decision diagram. The method includes identifying one or more less probable positive paths within the binary decision diagram, wherein the one or more less probable paths within the binary decision diagram includes a number of decision nodes from a starting variable to a positive, binary logic "1" terminal node within the binary decision diagram; and eliminating the identified one or more less probable positive paths within the binary decision diagram; wherein identifying the one or more less probable positive paths within the binary decision diagram further includes: assigning $f$ to the binary decision diagram; assigning K to a depth threshold of the binary decision diagram; constructing a second binary decision diagram g by logically ORing together positive paths in $f$ that have a length above K; and wherein eliminating the identified one or more less probable positive paths in $f$ comprises obtaining an approximated function f', by conjuncting $f$ and the negation of g, such that $f'=f\bar{g}$.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description in conjunction with the accompanying drawings in which:

DETAILED DESCRIPTION

According to an embodiment, an approximation of a clock gating function is obtained by reducing the depth and, thus, the number of decision nodes, of its associated binary decision diagram ("BDD"). Without loss of generality, it is assumed that clock gating is performed in cycles when the clock gating function equals one. Therefore, the approximation method of the embodiment of the invention eliminates a set of positive paths (i.e., a binary logic "1") with the minimum probability that will result in a reduction of the depth of the BDD, thereby reducing the logic delay time of the BDD and the corresponding clock gating function and the associated power consumption of the digital logic circuit that the clock gating function is a part of Given a uniform distribution of variables, i.e., the probability of a variable becoming logic "0" (negative) is equal to the probability of the variable becoming logic "1" (positive), the longest positive BDD path or multiple paths with maximal length correspond to a relatively less probable true-assignment of the clock gating function. Thus, by eliminating a less probable positive BDD path, the approximation error is minimized, as the on-set probability is defined by the sum of the probabilities of the positive BDD paths. This enables the use of additional clock gating functions in the design of, e.g., sequential digital logic circuits, including the approximation of those that do not satisfy certain timing constraints and heretofore were unable to have their BDDs further reduced in terms of path length.

Figure 1:
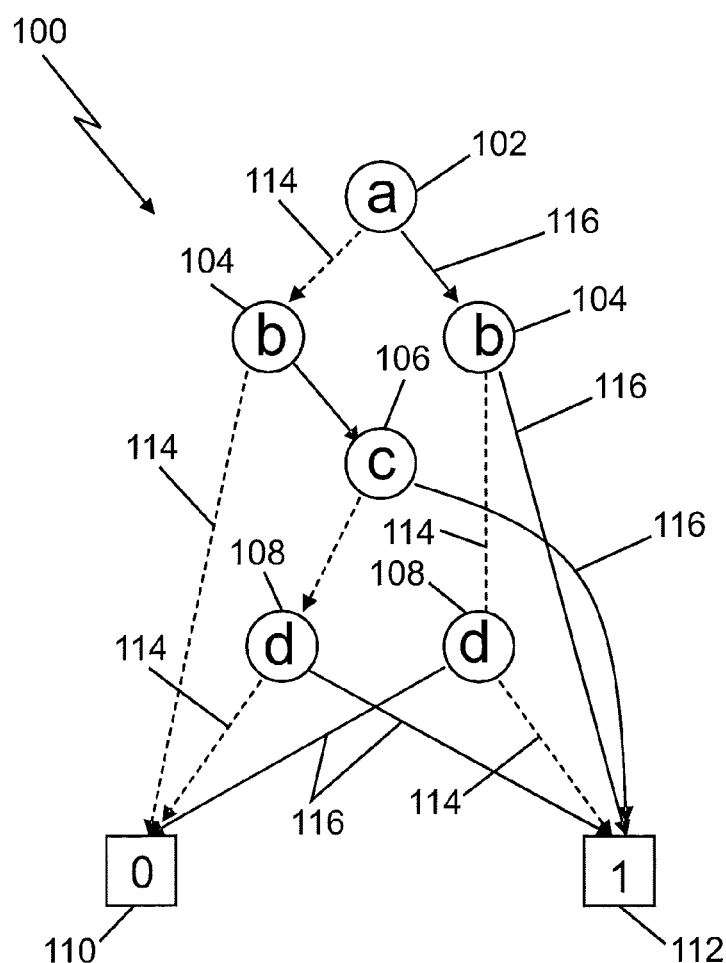
FIG. 1 is a BDD of an exemplary clock gating function prior to the application of the approximation algorithm of an embodiment of the invention.

Referring to FIG. 1, there illustrated is an exemplary binary decision diagram ("BDD") 100 of a Boolean function that represents a clock gating function used in, e.g., a sequential digital logic circuit having one or more flip-flops (not shown). The exemplary BDD 100 of FIG. 1 includes four Boolean variables—a, b, c and d—as also shown in the corresponding truth table 200 of FIG. 2. The BDD 100 of FIG. 1 is shown prior to the application of the approximation method according to an embodiment of the invention. The four variables, a-d, correspond to the decision nodes 102-108 in the BDD 100. Also shown in the BDD 100 of FIG. 1 are the "0-terminal" node 110 and the "1-terminal" node 112. In the BDD 100 of FIG. 1, a dotted line 114 from one decision node 102-108 to another decision node (and including to the terminal nodes 110-112) indicates that the corresponding "starting" variable, a-d, (i.e., the variable at the beginning of a line) is a logic "0", while a solid line 116 indicates that the corresponding starting variable of a line is a logic "1".

Figure 2:
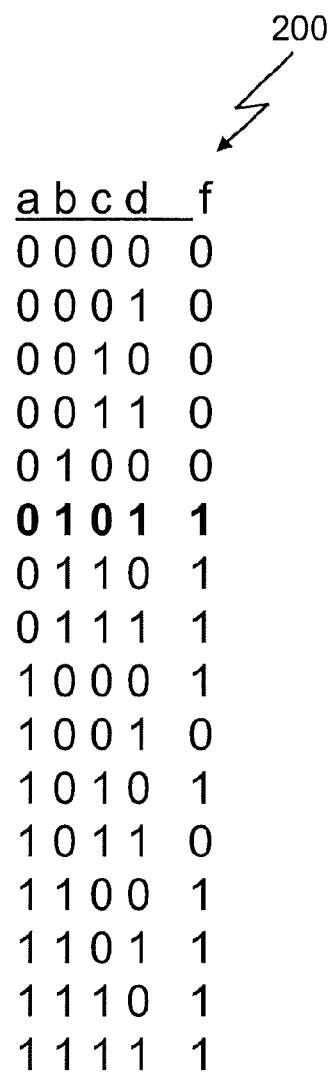
FIG. 2 is a truth table of the BDD of FIG. 1.

In the truth table 200 of FIG. 2, all 16 (i.e., $2^4$) possible combinations of the Boolean variables, a, b, c and d, are shown. Also shown in the rightmost column of the truth table 200 is the resulting function, f, which corresponds to the value of either the "0-terminal" node 110 (i.e., binary logic "0") or the "1-terminal" node (i.e., a binary logic "1") depending on the path through the BDD 100 of FIG. 1 for each of the 16 possible combinations of the variables a-d. Thus, as an example, to find the value for the function, f, for a=1, b=0, c=0 (or 1), and d=0, one starts out by following the solid line 116 originating from the variable a 102 to the variable b 104, then following the dotted line 114 from the variable b 104 to the variable d 108, the following the dotted line 114 from the variable d 108 to the "1-terminal" node 112, which indicates that f equals a binary logic "1". The combination of these lines between the specific variables is termed a "path" through the BDD 100. In the BDD 100 of FIG. 1, any path through the variables a-d beginning at the variable a 102 and ending at the "1-terminal" node 112 is termed a "positive" path, while any path through the variables a-d beginning at the variable a and ending at the "0-terminal" node 110 is termed a "negative" path. The "length" of a path is the number of BDD nodes 102-108 comprising that path.

An inspection of the BDD 100 of FIG. 1 together with the truth table 200 of FIG. 2 indicates that the longest positive path (f=1) through the BDD 100 is where a=0, b=1, c=0 and d=1 (i.e., there are four nodes 102-108 in this path, one for each of the variables a, b, c and d). This is also shown in the truth table 200 of FIG. 2. According to an embodiment of the invention, an approximation of a clock gating function is obtained by reducing the depth or length of the path (and, thus, the number of decision nodes 102-108) of its associated BDD. Specifically, the approximation method of the embodiment of the invention eliminates a less probable positive path (i.e., the path described above where a=0, b=1, c=0 and d=1, and f=1, which is the longest path) or, in the alternative, multiple paths with maximal length (i.e., where there exist multiple paths with maximal length) in the BDD 100 of FIG. 1, thereby reducing the logic delay time of the BDD and the corresponding clock gating function represented by the BDD and the associated power consumption of the digital logic circuit that the clock gating function is a part of Given a uniform distribution of variables, i.e., the probability of a variable becoming logic "0" (negative) is equal to the probability of the variable becoming logic "1" (positive), the longest positive path through the BDD 100 (or multiple paths with maximal length) corresponds to a relatively less probable true-assignment (i.e., f=1) of the clock gating function. A "probability" of a path through the BDD is defined by the probability of traversing the path given a valuation of the function variables a-d.

Thus, by eliminating a less probable positive path through the BDD 100, the approximation error is minimized, as the on-set probability is defined by the sum of the probabilities of the positive paths through the BDD 100. This enables the use of additional clock gating functions in the design of, e.g., sequential digital logic circuits, including the approximation of those that do not satisfy certain timing constraints and heretofore were unable to have their BDDs further reduced in terms of path length.

Figures 3, 4:
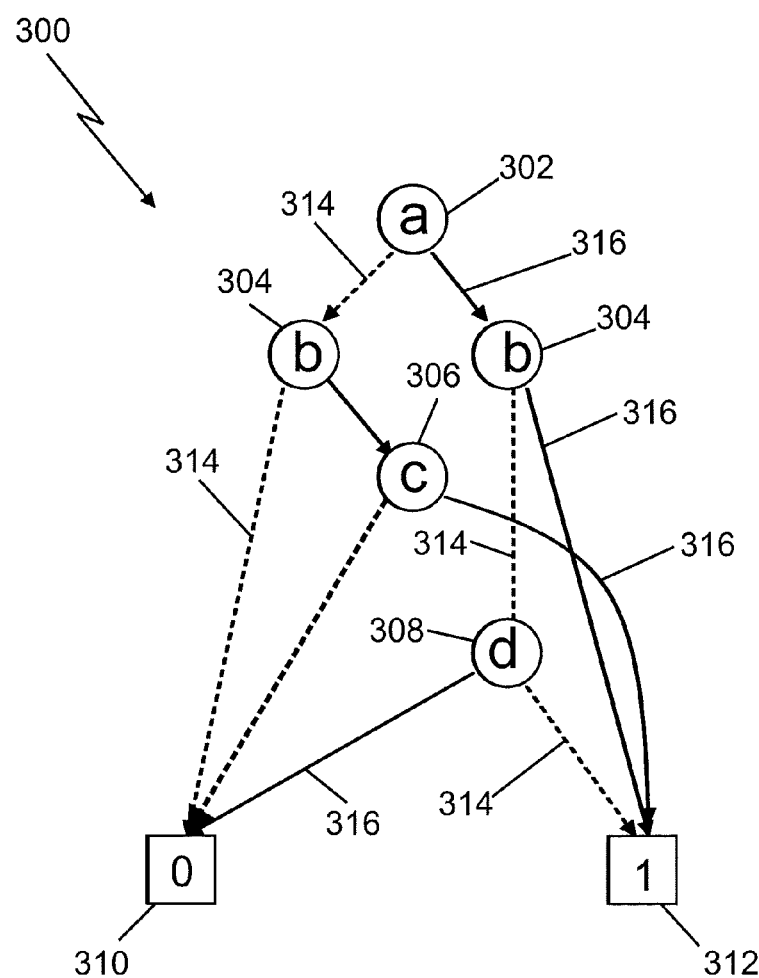
FIG. 3 is a BDD of an exemplary clock gating function after the application of the approximation algorithm of an embodiment of the invention.
FIG. 4 is a truth table of the BDD of FIG. 3.

FIG. 3 illustrates the BDD 300 after application of one iteration of the approximation method in accordance with an embodiment of the invention. FIG. 4 shows the resulting truth table 400. The approximation algorithm removed or eliminated one of the nodes 108 in FIG. 1 that corresponded to the variable d, as noted above, which node 108 was part of the longest path in the BDD 100 of FIG. 1. From the truth table 400 of FIG. 4, it is apparent that the number of 1's in the "f" column is reduced by only one (i.e., f=0 now for a=0, b=1, c=0 and d=1) in the approximated function. This results in a tighter possible approximation.

The approximation method according to an embodiment of the invention is given as follows:
(1) Let $f$ be the candidate BDD for approximation and let K be the depth threshold. For example, the candidate BDD is the BDD 100 of FIG. 1 and the depth threshold K equals 3 (i.e., no more than 3 nodes 114, 116 in a path that goes from the variable a decision node 102 to the "1-terminal" 112.
(2) Construct another BDD g, by logically ORing together the positive paths in $f$ that have a length above K.
(3) Eliminate the less probable paths (e.g., the longest path or multiple paths with maximal length) in $f$, obtaining an approximated function $f'$, by conjuncting $f$ and the negation of g, i.e., $f'=f\hat{}g$. An example for g from the truth table 400 of FIG. 4 is where g=(not a) and b and (not c) and d.

Besides being an example of the approximation method of an embodiment of the invention, the example above also shows that approximating this function by eliminating any variable by using universal quantification results in a relatively less tight approximation than that obtained using embodiments of the invention and will not necessarily improve the worst delay (or number of steps required to evaluate this function).

The goal of eliminating the less probable paths in a BDD (e.g., the longest path or the one or more paths with maximal length) is to reduce the logic delay of the resulting BDD implementation, e.g., of FIG. 3. In addition, given a uniform distribution of variables, i.e., the probability of a variable becoming logic "0" is equal to the probability of the variable becoming logic "1", long positive BDD paths correspond to less probable true-assignment of the function. Thus, by eliminating the one or more longest positive BDD paths (namely, the less probable ones) in an embodiment of the invention, the approximation error is minimized, as the on-set probability is defined by the sum of the probabilities of the positive BDD paths. In the alternative, the method embodiments of the invention are also applicable to the case where the probabilities of the BDD variables are not uniform (i.e., non-uniform signal probabilities). In this case, the less probable BDD path is not necessarily the longest one. Therefore, removing the less probable path may not lead to depth reduction, and furthermore, removing the longest path may result in an approximation which is not tight enough (e.g., when the longest path is also the most probable one). Thus, when approximating a BDD defined over non-uniformly distributed variables, one would have to trade-off approximation error for average delay of the BDD.

Advantages of embodiments of the invention include that they allow one to obtain timing-aware approximated functions. Also, they can be performed efficiently, namely in the complexity of one BDD apply operation, while also obtaining relatively small-error approximations, given a uniform variables distribution. Embodiments of the invention are applicable to any power optimization tool performing clock gating, or to logic synthesis and logic verification tools that use BDD approximations.

Figure 5:
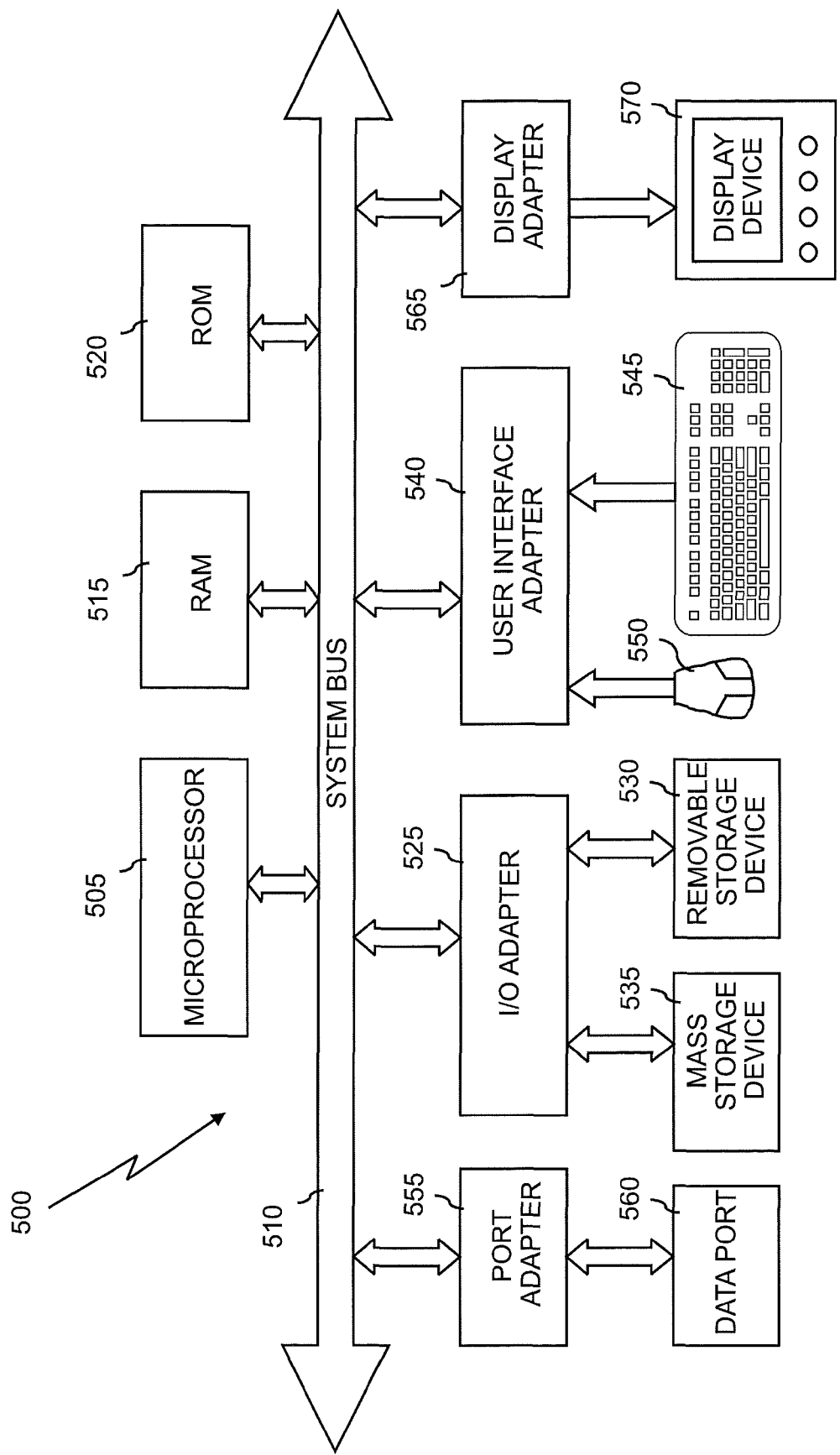
FIG. 5 a schematic block diagram of a general-purpose computer suitable for practicing embodiments of the present invention.

Generally, the method embodiments disclosed herein may be practiced with a general-purpose computer and the method embodiments may be coded as a set of instructions on removable or hard media for use by the general-purpose computer. FIG. 5 is a schematic block diagram of a general-purpose computer suitable for practicing embodiments of the present invention. In FIG. 5, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the embodiments of the method described above and illustrated in FIGS. 3 and 4.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method for reducing a depth of binary decision diagram, comprising:
    identifying, with a processing device, one or more less probable positive paths within the binary decision diagram, wherein the one or more less probable positive paths within the binary decision diagram include a number of decision nodes from a starting variable to a positive, binary logic "1" terminal node within the binary decision diagram; and
    eliminating, using the processing device the identified one or more less probable positive paths within the binary decision diagram;
    wherein identifying the one or more less probable positive paths within the binary decision diagram further comprises:
    assigning $f$ to the binary decision diagram;
    assigner K to a depth threshold of the binary decision diagram;
    constructing a second binary decision diagram g by logically ORing together positive paths in $f$ that have a length above K; and
    wherein eliminating the identified one or more less probable positive paths in $f$ comprises obtaining an approximated function $f'$, by conjuncting $f$ and the negation of g, such that $f' = f \wedge \bar{g}$.

2. The method of claim 1, wherein the binary decision diagram is representative of a clock gating function.

3. The method of claim 1, wherein the identified one or more less probable positive paths within the binary decision diagram corresponds to the one or more longest positive paths.

4. The method of claim 1, wherein eliminating the identified one or more less probable positive paths within the binary decision diagram reduces the number of decision nodes within the binary decision diagram.

5. The method of claim 1, wherein eliminating the identified one or more less probable positive paths within the binary decision diagram reduces a number of positive binary logic "1s" in a truth table representation of the binary decision diagram.

6. The method of claim 1, wherein identifying the one or more less probable positive paths within the binary decision diagram considers a uniform distribution of a plurality of variables within the binary decision diagram, and wherein a probability of one of the plurality of variables becoming a binary logic "0" is equal to a probability of the one of the plurality of variables becoming a binary logic "1".

7. A computer program product, comprising:
    a storage medium having computer-readable instructions stored thereon that, when executed by a computer, implement a method for reducing a depth of a binary decision diagram
    wherein the method comprises:
    identifying one or more less probable positive paths within the binary decision diagram, wherein the one or more less probable paths within the binary decision diagram include a number of decision nodes from a starting variable to a positive, binary logic "1" terminal node within the binary decision diagram; and
    eliminating the identified one or more less probable positive paths within the binary decision diagram;

wherein identifying the one or more less probable positive paths within the binary decision diagram further comprises:
assigning $f$ to the binary decision diagram;
assigning K to a depth threshold of the binary decision diagram;
constructing a second binary decision diagram g by logically ORing together positive paths in $f$ that have a length above K; and
wherein eliminating the identified one or more less probable paths in $f$ comprises obtaining an approximated function $f'$, by conjuncting $f$ and the negation of g, such that $f'=f\hat{}\overline{g}$.

8. The computer program product of claim 7, wherein the binary decision diagram is representative of a clock gating function.

9. The computer program product of claim 7, wherein the identified one or more less probable positive paths within the binary decision diagram correspond to the one or more longest positive paths.

10. The computer program product of claim 7, wherein eliminating the identified one or more less probable paths within the binary decision diagram reduces the number of decision nodes within the binary decision diagram.

11. The computer program product of claim 7, wherein eliminating the identified one or more less probable positive paths within the binary decision diagram reduces a number of positive binary logic "1s" in a truth table representation of the binary decision diagram.

12. The computer program product of claim 7, wherein identifying the one or more less probable paths within the binary decision diagram considers a uniform distribution of a plurality of variables within the binary decision diagram, and wherein a probability of one of the plurality of variables becoming a binary logic "0" is equal to a probability of the one of the plurality of variables becoming a binary logic "1".

13. A system for performing a reduction in a depth of a binary decision diagram, comprising:
a computing network including a processing device in communication with one or more computer memory storage devices; and
the computing network further configured to implement a method for reducing a depth of a binary decision diagram, the method further comprising:
identifying one or more less probable positive paths within the binary decision diagram, wherein the one or more less probable paths within the binary decision diagram includes a number of decision nodes from a starting variable to a positive, binary logic "1" terminal node within the binary decision diagram; and
eliminating the identified one or more less probable positive paths within the binary decision diagram;
wherein identifying the one or more less probable paths within the binary decision diagram further comprises:
assigning $f$ to the binary decision diagram;
assigner K to a depth threshold of the binary decision diagram;
constructing a second binary decision diagram g by logically ORing together positive paths in $f$ that have a length above K; and wherein eliminating the identified one or more less probable positive paths in $f$ comprises obtaining an approximated function $f'$, by conjuncting $f$ and the negation of g, such that $f'=f\hat{}\overline{g}$.

14. The system of claim 13, wherein the binary decision diagram is representative of a clock gating function.

15. The system of claim 13, wherein the identified one or more less probable positive paths within the binary decision diagram corresponds to the one or more longest positive paths.

16. The system of claim 13, wherein eliminating the identified one or more less probable positive paths within the binary decision diagram reduces the number of decision nodes within the binary decision diagram.

17. The system of claim 13, wherein eliminating the identified one or more less probable positive paths within the binary decision diagram reduces a number of positive binary logic "1s" in a truth table representation of the binary decision diagram.

18. The system of claim 13, wherein identifying the one or more less probable positive paths within the binary decision diagram considers a uniform distribution of a plurality of variables within the binary decision diagram, and wherein a probability of one of the plurality of variables becoming a binary logic "0" is equal to a probability of the one of the plurality of variables becoming a binary logic "1".

19. A method for reducing a depth of binary decision diagram, comprising:
identifying, with a processing device, one or more less probable positive paths within the binary decision diagram, wherein the one or more less probable positive paths within the binary decision diagram include a number of decision nodes from a starting variable to a positive, binary logic "1" terminal node within the binary decision diagram, wherein identifying the one or more less probable positive paths within the binary decision diagram further comprises assigning $f$ to the binary decision diagram, assigning K to a depth threshold of the binary decision diagram, and constructing a second binary decision diagram g by logically ORing together positive paths in $f$ that have a length above K; and
eliminating, using the processing device, the identified one or more less probable positive paths within the binary decision diagram $f$ by obtaining an approximated function $f'$, by conjuncting $f$ and the negation of g, such that $f'=f\hat{}\overline{g}$.

20. The method of claim 19, wherein the binary decision diagram is representative of a clock gating function.

21. The method of claim 19, wherein the identified one or more less probable positive paths within the binary decision diagram corresponds to the one or more positive paths.

22. The method of claim 19, wherein eliminating the identified one or more less probable positive paths within the binary decision diagram reduces the number of decision nodes within the binary decision diagram, and reduces a number of positive binary logic "1s" in a truth table representation of the binary decision diagram.

* * * * *